(12) United States Patent
Baran et al.

(10) Patent No.: US 10,025,882 B2
(45) Date of Patent: Jul. 17, 2018

(54) PARTITIONING MODELS INTO 3D-PRINTABLE COMPONENTS

(75) Inventors: Ilya Baran, Zurich (CH); Linjie Luo, Princeton, NJ (US); Wojciech Matusik, Zurich (CH)

(73) Assignee: Disney Enterprises, Inc., Burbank, CA (US)

( * ) Notice: Subject to any disclaimer, the term of this patent is extended or adjusted under 35 U.S.C. 154(b) by 1163 days.

(21) Appl. No.: 13/585,383

(22) Filed: Aug. 14, 2012

(65) Prior Publication Data

US 2014/0052415 A1   Feb. 20, 2014

(51) Int. Cl.
| | | |
|---|---|---|
| G06G 7/48 | (2006.01) | |
| G06F 17/50 | (2006.01) | |
| B33Y 50/00 | (2015.01) | |
| B29C 64/386 | (2017.01) | |

(52) U.S. Cl.
CPC ............ *G06F 17/50* (2013.01); *B29C 64/386* (2017.08); *B33Y 50/00* (2014.12)

(58) Field of Classification Search
CPC ....................................................... G06F 17/50
USPC ............................................................. 703/6
See application file for complete search history.

(56) References Cited

U.S. PATENT DOCUMENTS

| | | | |
|---|---|---|---|
| 5,879,489 A | 3/1999 | Burns et al. | |
| 5,945,996 A | 8/1999 | Migdal et al. | |
| 6,580,426 B1 | 6/2003 | Small et al. | |
| 2002/0008335 A1 | 1/2002 | Leyden et al. | |
| 2008/0225048 A1 | 9/2008 | Bijankumar et al. | |
| 2009/0256836 A1 | 10/2009 | Fowler et al. | |
| 2011/0087350 A1 | 4/2011 | Fogel et al. | |
| 2011/0222081 A1 | 9/2011 | Yi et al. | |

OTHER PUBLICATIONS

Xin et al.: Making Burr Puzzles from 3D Models. ACM Trans. Graph. 30, 4, Article 97 (Jul. 2011), 8 pages.*
Nguyen et al.: Best Cuts of a Set of Hyperrectangles, (Extended Abstract); 9th European Workshop on Computational Geometry 'CG 93: abstracts ; Mar. 18-19, 1993, Hagen, German; 1993; pp. 1-5.*
Nguyen et al.: Binary space partitions for sets of hyperrectangles; Algorithms, Concurrency and Knowledge; Lecture Notes in Computer Science; vol. 1023, 1995, pp. 59-72.*
Jiang et al.: Part decomposing algorithm based on STL solid model used in shape deposition manufacturing process; Int J Adv. Man. Tech. (2010) 54:187-194.*
Ilinkin et al.: A decomposition-based approach to layered manufacturing; Computational Geometry 23 (2002) 117-151.*

(Continued)

*Primary Examiner* — Hugh Jones
(74) *Attorney, Agent, or Firm* — Patterson + Sheridan, LLP (57) ABSTRACT

The disclosure provides a technique for recursively partitioning a 3D model of an object into two or more components such that each component fits within a predefined printing volume. The technique includes determining a set of planar cuts each of which partitions the 3D model into at least two components, evaluating one or more objective functions for each cut in the set of planar cuts, and selecting a cut from the set of planar cuts based on the evaluations of the objective functions. In addition, the technique includes, upon determining that a component resulting from the selected cut does not fit within the predefined printing volume, further partitioning that component.

19 Claims, 6 Drawing Sheets

(56) References Cited

OTHER PUBLICATIONS

Medellin et al.: Automatic Subdivision and Refinement of Large Components for Rapid Prototyping Production; J. Comput. Inf. Sci. Eng. 7(3), 249-258 (Mar. 13, 2006) (abstract only: 2 pages).*

Nowrouzezahrai et al. Multi-objective shape segmentation and labeling; Eurographics Symposium on Gometry Processing 2009; vol. 28 (2009), No. 5; 11 pages.*

Reed et al.: CAD model acquisition using BSP trees; Proceedings. 1995 IEEE/RSJ International Conference on; 1995; pp. 335-340.*

Tang et al.: An algorithm for disintegrating large and complex rapid prototyping objects in a CAD environment; Int J Adv Manuf Technol (2005) 25: 895-901.*

Medellin, H.; Lim, T.C.; Corney, J.R.; Ritchie, J.M.; Davies, J.B.C., "Automatic Subdivision and Refinement of Large Components for Rapid Prototyping Production", Journal of Computing and Information Science in Engineering, vol. 7, No. 3, Sep. 2007, p. 249-258.

Hao, J.; Fang, L.; Williams, R. "An Efficient Curvature-Based Partitioning of Large-Scale STL Models", Rapid Prototyping Journal, vol. 17, No. 2, 2011, p. 116-127, Mar. 2011.

Medellin, H.; Lim, T.C.; Corney, J.R.; Ritchie, J.M.; Davies, J.B.C., "Automatic Subdivision and Refinement of Large Components for Rapid Prototyping Production", Journal of Computing and Information Science in Engineering, vol. 7, No. 3, Sep. 2007, p. 249-258.

Martens, B; Stellingwerff, M; Creating Physical Models Using Virtual Reconstructions: Mixed Camtechniques for a Viennese Synagogue Scale-Model, SIGRaDI 2005 {Proceedings of the 9th Iberoamerican Congress of Digital Graphics] Lima, Peru, vol. 1, Nov. 2005, p. 108-113.

Xin, Shiqing; Lai, Chi-Fu; Fu, Chi-Wing; Wong, Tien-Tsin; He, Ying; Cohen-Or, Daniel, "Making Burr Puzzles from 3D Models", ACM Transactions on Graphics (SIGGRAPH 2011 Issue) vol. 30, No. 4, abstract only, Jul. 2011.

Hao, J.; Fang, L.; Williams, R. "An Efficient Curvature-Based Partitioning of Large-Scale STL Models", Rapid Prototyping Journal, vol. 17, No. 2, 2011, p. 116-127.

* cited by examiner

PARTITIONING MODELS INTO 3D-PRINTABLE COMPONENTS

BACKGROUND

Field

This disclosure presents techniques related to 3D printing. More specifically, this disclosure presents techniques to partition 3D objects into smaller components so that each component can be printed by a 3D printer having limited printing volume.

Description of the Related Art 3D printers print three-dimensional objects and are analogous to conventional printers in that, for example, a 3D surface may be printed by applying layer after layer of a substrate until completing a desired 3D structure, much like conventional printers apply a layer of ink to paper. Various types of 3D printers have been designed, and these 3D printers use a variety of raw materials for printing.

One limitation of current 3D printers is printing volume, which limits the size of an object that can be printed using a given system. Objects that do not fit within the printing volume (e.g., objects that are too long or too large) either cannot be printed or need to be partitioned before being printed. One approach to printing objects that do not fit within a given printing volume is for a user to manually partition 3D models of those objects. The 3D printer then prints the components resulting from the manual partitioning. However, manual partitioning is often a laborious process which does not guarantee that resulting components can be assembled, that the partitioned components can be printed, or that the components, once printed and/or assembled, will be structurally sound. Similarly, while some approaches for automated partitioning have been developed, currently available techniques have various drawbacks, including, but not limited to, using too many cuts, ignoring object features, making poor use of printing volume, not considering printing components in different orientations, not guaranteeing that a structure can be printed and assembled after printing, and not ensuring that the structure will be structurally sound after printing and/or assembly.

SUMMARY

One embodiment of the invention provides a computer implemented method for recursively partitioning a 3D model of an object into two or more components such that each component fits within a predefined printing volume. The method includes determining a set of planar cuts each of which partitions the 3D model into at least two components, evaluating one or more objective functions for each cut in the set of planar cuts, and selecting a cut from the set of planar cuts based on the evaluations of the objective functions. In addition, the technique includes, upon determining that a component resulting from the selected cut does not fit within the predefined printing volume, further partitioning that component.

Other embodiments include, without limitation, a computer-readable medium that includes instructions that enable a processing unit to implement one or more embodiments of the disclosed methods as well as a system configured to implement one or more embodiments of the disclosed methods.

BRIEF DESCRIPTION OF THE DRAWINGS

So that the manner in which the above recited embodiments are attained and can be understood in detail, a more particular description of embodiments of the invention, briefly summarized above, may be had by reference to the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Embodiments presented herein provide techniques for partitioning computer models representing three-dimensional (3D) objects so that the components of the partitioned objects can be printed within the printing volume of a 3D printer. Further, embodiments presented herein ensure that the components may be assembled. Further still, embodiments attempt to minimize the number of components of the partitioned model. In addition, embodiments attempt to minimize seam saliency of cuts (i.e., the visual obtrusiveness of cuts) while simultaneously maximizing structural soundness.

In one embodiment, a partition application recursively partitions an input model with planar cuts. For example, the partition application may sample a discrete set of potential cuts, pick one of the cuts by evaluating one or more objective functions, and recursively partition either side of the cut if the volume of that side does not fit within a given printing volume. In one embodiment, the partition application represents cuts using a binary space partition (BSP) tree. Doing so ensures that components resulting from partitioning can be assembled into a whole object because each side of a cut can always be individually assembled, and the individually assembled sides can then be combined. Once all components fit within the printing volume, the partition application places connectors for connecting the components. For example, in one embodiment, the simulated annealing technique is used to ensure that adjacent components have at least one connector and that no two connectors interfere with each other as well as avoiding the use of any unnecessary connectors.

Although steps may be described below as fully automated, alternative embodiments may permit or prompt for user assistance. That is, in some embodiments, the partitioning and connector-placement applications described herein may account for user input (e.g., user-defined preferences for partitions and connector locations) in performing their respective operations.

The following description references embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following embodiments, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Embodiments of the present invention may be embodied as a system, method or computer program product. Accordingly, embodiments of the present invention may take the form of an entirely hardware embodiment, an entirely software embodiment (including firmware, resident software, micro-code, etc.) or an embodiment combining software and hardware embodiments that may all generally be referred to herein as a "circuit," "module" or "system." Furthermore, embodiments of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special-purpose hardware-based systems that perform the specified functions or acts, or combinations of special purpose hardware and computer instructions.

Figure 1:
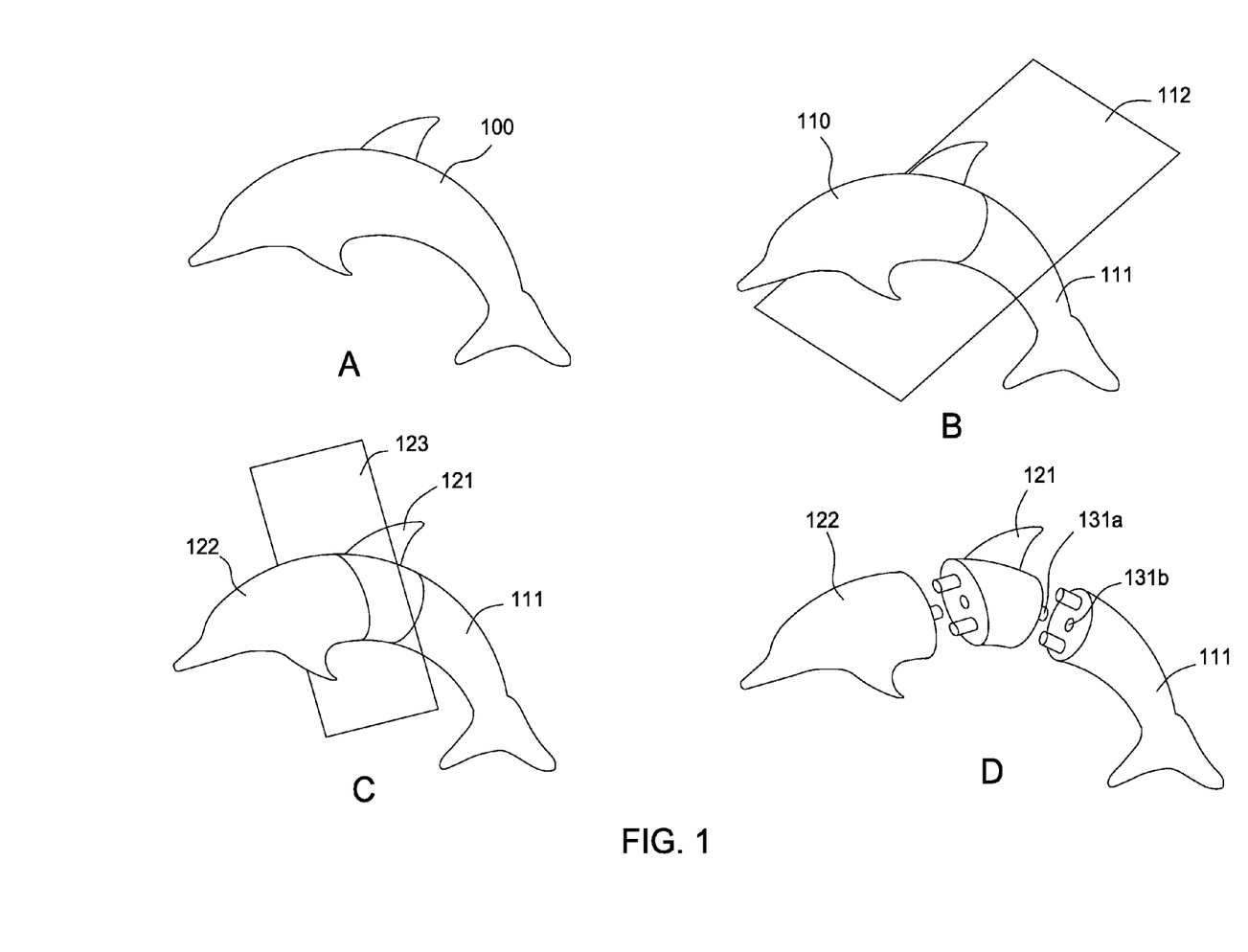
FIG. 1 depicts a partitioning of a 3D model and addition of connectors to each resulting component, according to one embodiment of the present disclosure.

FIG. 1 depicts a partitioning of a 3D model 100 and addition of connectors to each resulting component, according to one embodiment of the present disclosure. As shown in panel A, the model 100 is a virtual representation of a dolphin. The model 100 may include vertex and edge data representing the geometry of the dolphin. The model 100 may be created in any feasible manner. For example, the model 100 may be created by manually specifying vertex and edge data. Alternatively, the model 100 may be generated automatically based on a scan of a 3D object.

As shown in panel B, the model 100 is divided into components 110 and 111 by plane 112. The components 110 and 111 need not be equal or symmetrical. In one embodiment, the plane 112 is selected to ensure that each component 110 and 111 is structurally sound and that the model 100 is structurally sound after the components 110 and 111 are assembled together. In a further embodiment, the plane 112 is selected to ensure that at least one connector can be placed to connect components 110 and 111. In yet another embodiment, the plane 112 is selected to maximize or minimize a combination (e.g., a weighted sum, a product, etc.) of one or more objective functions. For example, one objective function may estimate an approximate worst-case number of final components if the cut is made. Another objective function may determine a measure of seam saliency given the cut. The results of such objective functions may be combined, and the partition application may compare the combined results of a plurality of potential cut planes to select a cut during a recursive iteration of the process.

As shown in panel C, component 110 is further divided into components 121 and 122 by plane 123. In some embodiments, the model 100 is recursively partitioned until deriving a set of component that each fit within a given printing volume. For example, after partitioning model 100 into components 110 and 111, component 111 may fit within the printing volume. In such a case, the partition application does not further partition component 111. On the other hand, if component 110 does not fit within the printing volume, the partition application further partition component 110 by performing steps similar to those taken to partition model 100 into components 110 and 111. This process repeats for resulting components until the terminating condition of the recursion—that the left or right side component after a cut fits within the printing volume—is reached. When such a terminating condition is reached, the recursion ends for that side of the cut.

Panel D illustrates components 111, 121, 122 of the model 100 after partitioning. The partition application may place one or more connectors 131 that link components 111, 121, 122 together such that the components do not fall apart or collapse under their own weight when assembled. As shown in panel D, component 111 is connected to component 121 via three connectors, and component 121 is connected to component 122 via three connectors. Each connector 131 includes a male end 131a and a female end 131b. The male 131a and female 131b ends reside on opposite sides of a cut and link together when the opposite sides are pressed together. The connectors 131 may be any feasible shape and size. Although depicted in panel D as cylinders of the same size, connectors of different shapes, sizes, and types may be used and may even be mixed and matched. In addition, the partition application may account for such variations in connector shapes, sizes, and types when making partitions and placing connectors.

In one embodiment, the partition application ensures that each cut permits placement of one or more connectors for holding the two sides of the cut together. In a further embodiment, discussed in greater detail below, a connector placement application places connectors for a partitioned model based on simulated annealing.

Figure 2:
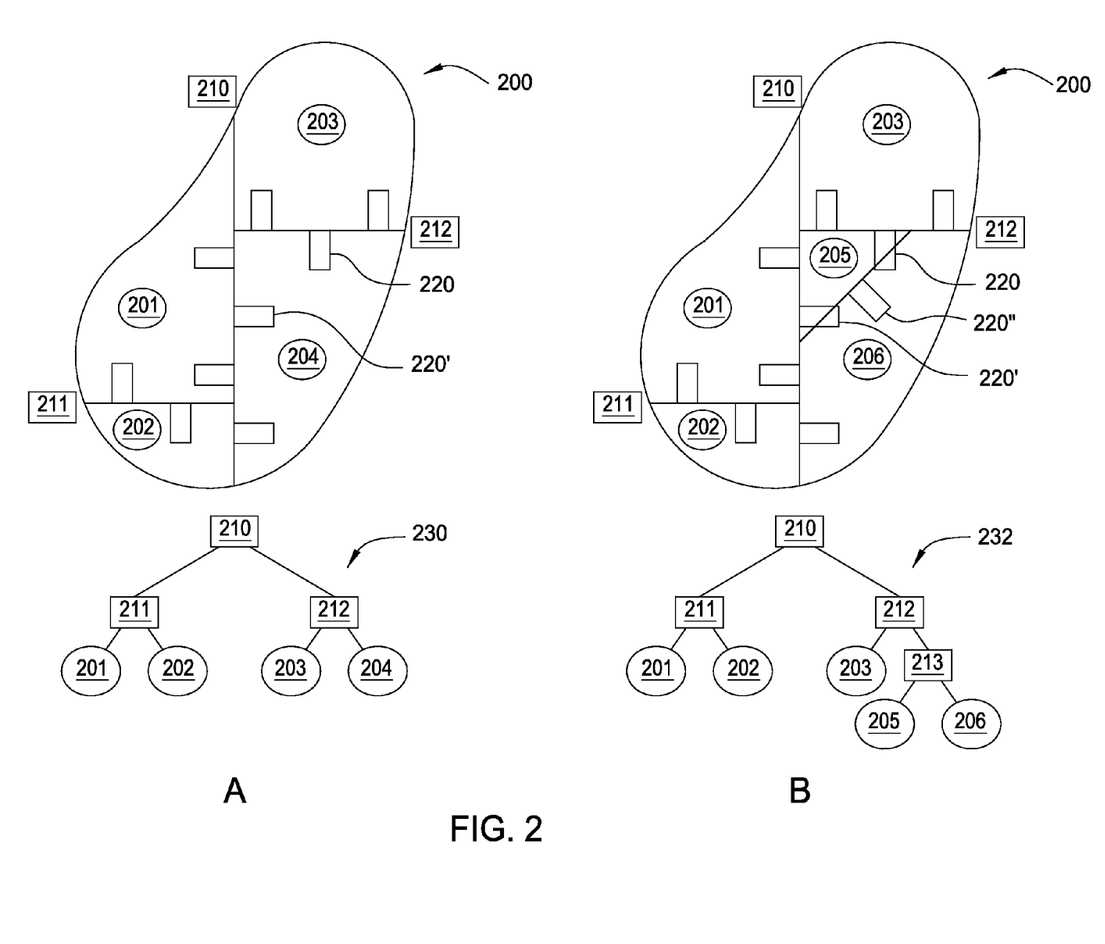
FIG. 2 depicts a cross-section view of a 3D model after multiple partitions and also illustrates binary space partition (BSP) trees corresponding to those partitions, according to an embodiment.

FIG. 2 depicts a cross-section view of a 3D model after multiple partitions and also illustrates binary space partition (BSP) trees corresponding to those partitions, according to an embodiment. As shown in frame A, the model 200 is partitioned into four components 201-204 by three cuts 210-212. Each cut may be represented as a node of BSP tree 230. As shown in the BSP tree 230, cut 210 was made first, because it appears at the root of the BSP tree 230. After cut 210, each of the left and right sides of cut 210 were further partitioned by cuts 211 and 212. As a result, model 200 is partitioned into four components 201-204, which are stored as the leaf nodes of BSP tree 230. Further, each of the components 201-204 shares at least one connector 220 with each component 201-204 that is adjacent to it.

Frame B depicts the model 200 after cut 213 is selected. As BSP tree 232 indicates, cut 213 divides dividing component 204 into components 205 and 206. Further, connectors 220 and 220' pierce component 205, ending in component 206. In this examples connectors 220 and 220' are invalid because the female ends of such connectors do not fit within one component. The partitioning application may be configured to only select cuts for which a valid connector placement is possible. presence of an invalid connector.

Figure 3:
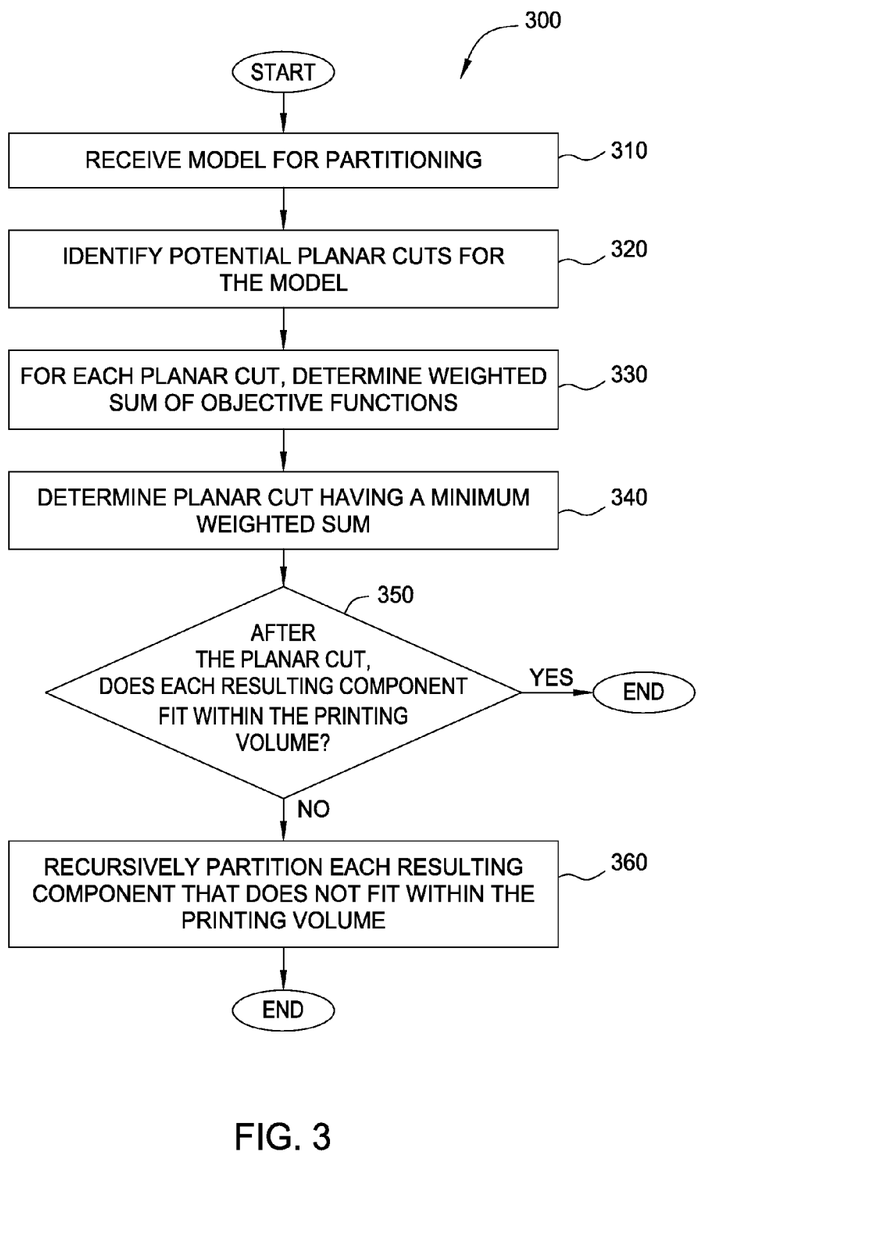
FIG. 3 illustrates a method for partitioning an object for 3D printing, according to one embodiment.

FIG. 3 illustrates a method for partitioning an object for 3D printing, according to one embodiment. The method 300 begins at step 310, where a partition application receives a model of an object for partitioning. The model may be any feasible three dimensional computer model of an object that does not fit within the printing volume of a desired 3D printer.

At step 320, the partition application determines potential planar cuts for the object. In one embodiment, the partition application may sample a large set of possible cuts planes $\Pi=\{\pi_{ij}|\pi_{ij}:n_i\cdot p-d_j=0\}$, where $n_i$ land $d_j$ are the normal and the offset of plane $\pi_{ij}$, respectively. In one embodiment, the partition application samples the set of normals $N=\{n_i\}$ by subdividing a unit icosahedrons twice, resulting in 81 uniformly distributed directions. Further, the partition application may sample the offset $d_j$ uniformly for each normal $n_i$ over a range for which planes $\pi_{ij}$ intersect the object.

In one embodiment, normals $n_i$ that are aligned with common face normals of the model and aligned with interfaces of the current component being analyzed may also be sampled. Further, although described with respect to uniform sampling based on subdivision of a unit icosahedron, embodiments may be adapted to use nonuniform sampling and/or other sampling patterns.

At step 330, each planar cut sampled at step 320 is analyzed to determine a weighted sum of objective function scores for that cut. Examples of objective functions may include ones used to measure, structural soundness, connector feasibility, number of resulting components, and seam saliency. Examples of objective functions are discussed in greater detail below in conjunction with a description of FIG. 4.

Some objective functions may be binary, indicating that a candidate cut is (or is not) feasible. Such binary objective functions may be used to reject infeasible cuts. Doing so may be an efficient mechanism for removing candidates, as more computationally expensive objective functions need not be invoked to evaluate cuts removed by a binary objective function. For example, cuts for which resulting components lack structural soundness (i.e., are likely to fall apart or collapse under their own weight), or for which connectors cannot be placed, may be rejected based on one or more binary objective functions.

Other objective functions may return a numerical score for a given candidate cut. For cuts not rejected as failing a binary objective function, the partition application may rank the cuts according to the numerical objective function scores for those cuts or a combination (e.g., a weighted sum, a product, etc.) of those numerical objective function scores. The partition application may then select a cut having a maximum (or minimum) overall score. For example, the partition application may evaluate objective functions relating to number of components and seam saliency and select a cut that is predicted, based on a weighted sum of the objective functions, to result in relatively few total components and relatively invisible seams.

In some embodiments, the objective functions may be evaluated in a predefined order. For example, binary objective functions likely to reject a large number of potential cuts may be evaluated earlier than other objective functions. For many cuts, the partition application evaluates only binary objective functions before rejecting the cut.

After determining scores for each objective function for a set of candidate cuts, the partition application determines a final score for the objective functions taken together. In one embodiment, the partition application may compute a linear combination of the separate scores of all objective functions for the plane $\pi$:

$$f(\pi) = \Sigma_k \alpha_k f_k(\pi), \quad (1)$$

where each coefficient $\alpha_k$ represents a weight for a corresponding objective function $f_k(\pi)$. Any feasible coefficients, positive and negative, may be used. For example, the coefficients $\alpha_k$ may be selected to emphasize some objective functions over others.

In one embodiment, some objective functions are evaluated on a batch of parallel candidate planar cuts, rather than one planar cut at a time. Doing so may provide optimization opportunities for some objective functions.

At step 340, the partition application ranks the sampled cuts based on a combination of the objective functions and determines a planar cut having a maximum or minimum combined score. Whether a maximum or minimum weighted sum is selected depends on the objective functions. For objective functions returning higher scores for less desirable cuts, the partition application may select a cut having a minimum combined score, and vice versa.

In one embodiment, the partition application may represents the selected cut as a node of a BSP tree, e.g., to the BSP tree depicted in FIG. 2. The partition application may further store the components resulting from the cut in leaf nodes of the BSP tree.

At step 350, the partition application determines whether each of the left and right side components resulting from the cut determined at step 340 fit within the printing volume. If each component fits within the printing volume, then the method 300 ends because no further partitioning is necessary.

Alternatively, if the partition application determines at step 350 that the left and/or right side components do not fit within the printing volume, then the method 300 continues at step 360, where the partition application recursively partitions each such component according to method 300. That is, each component that does not fit within the printing volume is itself treated as a model for partitioning and partitioned via method 300.

Although sometimes described herein with reference to a left and a right side component, further embodiments may account for cases in which more than two components result from a cut. In such embodiments, the partition application may treat recursively partition each resulting component that does not fit within the printing volume.

Figure 4:
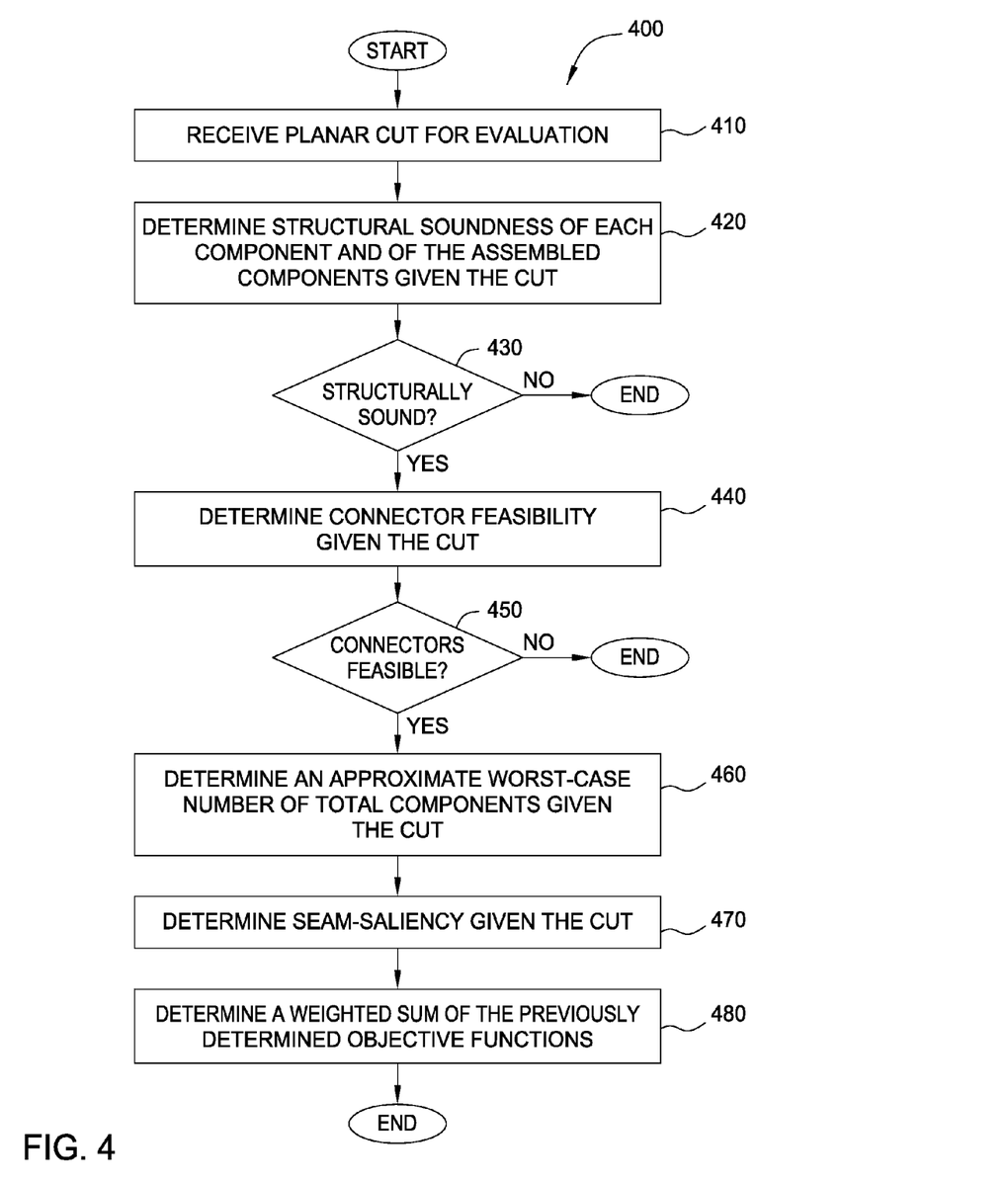
FIG. 4 illustrates a method for determining a weighted sum of objective functions, according to one embodiment.

FIG. 4 illustrates a method for determining a weighted sum of objective functions, according to one embodiment. As shown, the method 400 begins at step 410, where a partition application receives a planar cut for evaluation. At step 420, the partition application determines the structural soundness of each component and the structural soundness of the assembled components given the cut. In one embodiment, the partition application may voxelize the model of each component and the assembled components. In such a case, each voxel may represent a volume of three-dimensional geometry of the 3D model. The partition application may estimate the stress on each voxel to approximate the stress on each component and the assembled components (e.g., via the finite element method). Further, the partition application may account for various forces that induce stress, including gravity and other forces predicted to act on a given voxel.

In another embodiment, the partition application may assume that the components and the whole are structurally sound before the cut and determine whether a given cut introduces one or more structures that lead to fragility. For example, the partition application may determine whether one of the following structures is introduced in a component or in the whole: (1) a thin bridge structure that connects two large parts; (2) a thin fin structure extending from a main part. A necessary condition for these two structures to occur after a cut is that there exists a point on the structure whose tangential plane is substantially parallel to the cut plane $\pi$ and the distance from the point to the plane is sufficiently small. To eliminate these cases, the partition application may identify the set S of "critical" points on the surface of a component or the whole having normals $n_p$ whose dot product with the cut plane's normal n is greater than a predefined threshold $T_n$, i.e., $n_p \cdot n > T_n$. For each such critical point $p \in S$, the partition application may project the point p onto the cut plane $\pi$ and determine whether the height $h(p)$ of the point p to the cut plane $\pi$ is greater than a predefined threshold $T_h$. When projecting the point p onto the cut plane $\pi$, the partition application may disregard the point as likely to create structural fragility if the projection ray intersects with the surface of the component or whole before it hits the cut plane $\pi$, because in such cases the cut plane $\pi$ would not directly affect the structural properties at point p. Altogether, the structural soundness objective function $f_{soundness}(\pi)$ may be expressed as:

$$f_{soundness}(\pi) = \begin{cases} 0, \forall p \in S, h(p) > T_h \\ \infty, \text{otherwise} \end{cases} \quad (2)$$

At step 430, the partition application rejects the cut if either a component or the whole is determined to be structurally unsound at step 420. For example, the partition application may reject the cut based on equation (2) if equation (2) returns a value of $\infty$. If the cut is rejected at step 430, the method 400 ends thereafter so that further objective functions are not calculated for this candidate cut.

Otherwise, at step 440, the partition application determines whether connectors may be placed for each component given the cut. Connector placement may be infeasible for various reasons. For example, a female end of a connector may not fit completely within a component, two or more male ends of connectors may interfere with each other, or a cross section of a cut may be too small to permit a connector. For example, cut 213 of FIG. 2 invalidates connectors 220 and 220' because the female ends of these connectors can no longer fit within one component. To ensure that components resulting from a cut do not fall apart after assembly, the partition application may require that one or more connectors can validly placed for each pair of elements on either side of a cut.

In one embodiment, the partition application samples a cross section of the cut to determine a set of possible locations for female parts on both sides of the cut. If the set is empty, the partition application may reject the cut. The partition application may further identify any previous connectors that are invalidated as a result of the cut (e.g., because the new cut splits the cross section of a previous cut through all feasible connector locations). If any previous cut has no remaining feasible connector locations as a result of the cut, the partition application may reject the cut. Otherwise, the partition application may indicate that connectors are feasible given the cut.

In an alternative embodiment, the partition application may set $f_{connector}(\pi)$ to a nonzero value indicating a size of the feasible connector set. That is, the partition application may prefer cuts having larger feasible connector sets, because even when future cuts invalidate some connectors in the set of feasible connectors, those future cuts will be less likely to invalidate all connectors in the set. As a result, fewer future cuts may be rejected for lack of connector feasibility.

In a further embodiment, female connectors may be modeled as unions of spheres, and a distance field may be used to store the distance to any surface or cut from points within the model. In such a case, the partition application may determine whether a potential connector is feasible based on a sampling of the distance field at locations of centers of spheres modeling the potential connector. In particular, the partition application may compare the sampled distances to the sphere radii to determine if the potential connector will fit completely within a given component.

At step 450, the partition application rejects the cut if connectors are not feasible after the cut. If the cut is rejected at step 450, the method 400 ends thereafter so that further objective functions are not calculated for the cut.

Otherwise, at step 460, the partition application determines an approximate worst-case number of total components given the cut, also referred to herein as an upper bound on the number of components $\Theta(P)$. To guarantee that the method 400 terminates, the partition application may attempt to divide each component P into subcomponents $P_i$ in a manner such that $\Theta(P)$ tends to decrease with each cut. In one embodiment, the partition application may set the number-of-components objective function $f_{comp}(\pi)$ to a value of $\infty$ where $\Theta(P) < \max_i \Theta(P_i)$. That is, the partition application may require that after the cut divides component P into subcomponents $P_i$, the upper bound $\Theta(P_i)$ of each subcomponent $P_i$ is less than the upper bound $\Theta(P)$ of the component P. Assuming this condition is met, the partition application may further calculate the objective function for number of components $f_{comp}(\pi)$ as:

$$f_{comp}(\pi) = \max_i \Theta(P_i) + \alpha_{sum} \Sigma_i \Theta(P_i) \quad (3)$$

At step 470, the partition application determines seam saliency given the cut. Less salient (i.e., less visibly obtrusive) cut seams are desirable, so the partition application is configured to prefer visually unobtrusive seams that run through parts of the surface where the seams are unlikely to be visible or distracting. In one embodiment, the partition application determines a penalty p for every point on the surface of the object to be cut. In such a case, the partition application may calculate the objective function for seam saliency $f_{seam}(\pi)$ by integrating the penalty p along the boundary of the cut:

$$f_{seam}(\pi) = \int_{\partial P \cap \pi} p \, dx \quad (4)$$

In one embodiment, the partition application determines the penalty p based at least on ambient occlusion at each point on the surface of the model, with points in self-occluded areas of the model's surface receiving a lesser penalty than points in non-occluded areas. In an additional embodiment, the partition application may determine the penalty p based at least on whether the cut occurs along a salient edge within a texture, with cuts occurring along such salient edges receiving lesser penalties than cuts occurring elsewhere (e.g., across such salient edges). In yet another embodiment, the partition application may determine the penalty based on user input. For example, the user may indicate an area of the model that a cut cannot cross, and the partition application may assess a penalty for points within that area.

At step 480, the partition application determines a weighted sum of the previously determined objective functions. That is, the partition application determines a final score for the cut by computing a linear combination of the separate scores of each objection function for the plane: $f(\pi) = \Sigma_k \alpha_k f_k(\pi)$. As discussed above, the coefficients $\alpha_k$ may be any feasible value. For example, the coefficients $\alpha_k$ may be selected to emphasize some objective functions over others.

Figure 5:
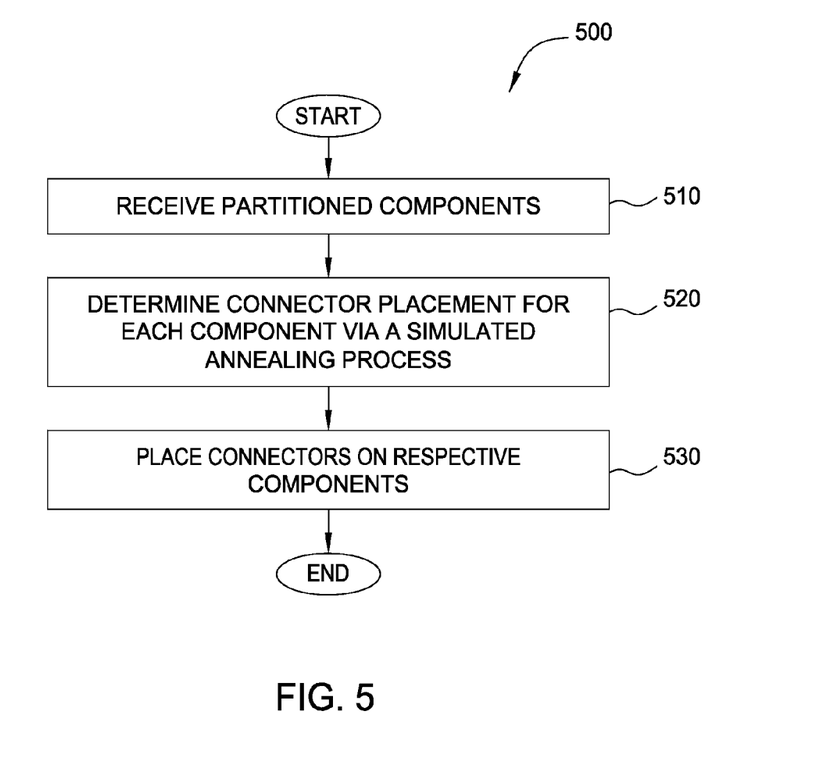
FIG. 5 illustrates a method for placing connectors on partitioned components, according to one embodiment.

FIG. 5 illustrates a method for placing connectors on partitioned components. The method 500 begins at step 510, where a connector placement application receives components that resulted from one or more cuts being made to a 3D model. In one embodiment, the cuts may be made according to the methods illustrated in FIGS. 3-4.

At step 520, the connector placement application may use a simulated annealing process to determine placements for connectors linking the received components. Each state during the simulated annealing process is a subset of all possible connectors. To determine an optimal state, the connector placement application repeatedly generates random mutations to perform one of the following actions with equal probability: (1) pick a connector from among all possible connectors and toggle the placement of the connector in the current state; (2) remove a random connector from the current state and add a different connector. The connector placement application then compares the randomly-generated state to the current state and accepts or rejects the randomly-generated state as a new current state based on a predefined strategy, such as a linear cooling schedule.

In one embodiment, the connector placement application minimizes the following objective during simulated annealing:

$$\omega_I \sum_{i,j} I_{i,j} + \sum_i \frac{c_i}{\epsilon + \max(0, c_i)}, \quad (5)$$

where $\omega_I$ is a large constant, $\epsilon$ is a small constant, $I_{i,j}$ is 1 if connectors i and j interfere and 0 otherwise, $C_i$ is the area of the cross-section connected component i, and $c_i$ is the area "covered" by the connectors on connected component i. For example, $\omega_I$ may be taken to be $10^{10}$ and $\epsilon$ may be taken to be $10^{-5}$. Such a small $\epsilon$ sets a high penalty when a cross-section connected component has no connectors.

In one embodiment, the area "covered" by the connectors $c_i$ may be approximated as the circular area $\pi r_C^2$. Here, $r_C$ is the radius of a circle and can be adjusted to, for example, allow more connectors to be placed on smaller cross-sections. In a further embodiment, the connector placement application may subtract $2\pi$ $$\left(r_C - \frac{d}{2}\right)^2$$

from $c_i$ whenever any two connectors are at less than $2r_C$ distance from each other. Such an approach ensures that connectors that are selected are spaced roughly $r_C$ apart. In yet another embodiment, the connector placement application may add $-c_i/C$ to equation (4) whenever $c_i$<0 for a given connector. Such an approach helps guide the simulated annealing optimization towards better solutions.

Although discussed above with respect to simulated annealing, persons skilled in the art will recognize that other approaches for approximately solving optimization problems may be used to determine placements for connectors linking the received components.

At step 530, the connector placement application places connectors at the locations determined at step 520. For example, the connector placement application may add the determined connectors to the models of the components. As a result, the components will include those connectors when printed by the 3D printer.

Figure 6:
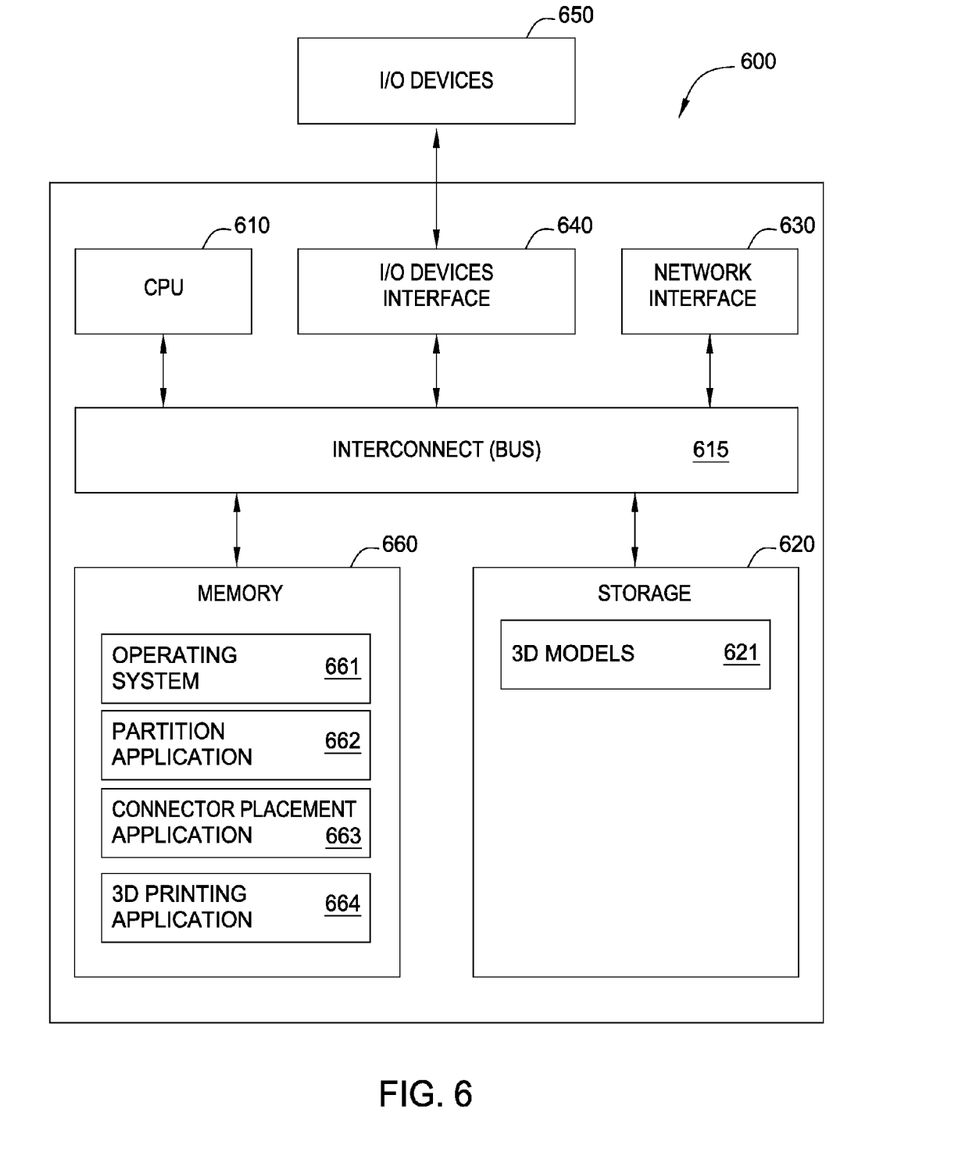
FIG. 6 depicts a block diagram of a system in which embodiments of the invention may be implemented.

FIG. 6 illustrates an example of a system 600 in which aspects of the disclosure may be implemented. As shown, the system 600 includes, without limitation, a central processing unit (CPU) 610, a network interface 630, an interconnect 615, a memory 660 and storage 620. The system 600 may also include an I/O device interface 640 connecting I/O devices 650 (e.g., keyboard, display and mouse devices) to the system 600. The I/O devices 650 may further include a 3D printer having limited printing volume.

The CPU 610 retrieves and executes programming instructions stored in the memory 660. Similarly, the CPU 610 stores and retrieves application data residing in the memory 660. The interconnect 615 facilitates transmission, such as of programming instructions and application data, between the CPU 610, I/O device interface 640, storage 620, network interface 630, and memory 660. CPU 610 is included to be representative of a single CPU, multiple CPUs, a single CPU having multiple processing cores, and the like. And the memory 660 is generally included to be representative of a random access memory. The storage 620 may be a disk drive storage device. Although shown as a single unit, the storage 620 may be a combination of fixed and/or removable storage devices, such as fixed disc drives, floppy disc drives, tape drives, removable memory cards or optical storage, network attached storage (NAS), or a storage area-network (SAN). Further, system 600 is included to be representative of a physical computing system as well as virtual machine instances hosted on a set of underlying physical computing systems. Further still, although shown as a single computing system, one of ordinary skill in the art will recognized that the components of the system 600 shown in FIG. 6 may be distributed across multiple computing systems connected by a data communications network.

As shown, the memory 660 includes an operating system 661 and applications 662-664. Illustratively, the operating system may include Microsoft's Windows®. The applications 662-664 include a partition application 662, which is configured to determine partitions for a 3D model of an object that does not fit within a predefined printing volume.

In one aspect, the partition application 662 is configured to select a set of planar cuts by recursively dividing the model based on one or more objective functions, as described in detail above with respect to FIGS. 3 and 4.

The applications 662-664 further include a connector placement application 663, which is configured to determine placement locations for connectors on interfaces of adjacent components of the partitioned model. In one aspect, the step planning application 663 is configured to determine connector placement locations via the simulated annealing technique described in detail above with respect to FIG. 5.

In addition, applications 662-664 include a 3D printing application 664, which may be configured to send signals to a 3D printer instructing it to print a partitioned 3D model. That is, the robot control application 664 may convert each component of the partitioned model and connectors attached thereto to instructions that are sent to the 3D printer, thereby causing the 3D printer to print an object according to those instructions.

Although described above as separate applications, in alternative embodiments, two or more of partition application 662, connector placement application 663, and 3D printing application 664 may be combined into a single application.

The storage 620 includes 3D models 621 for partitioning by partition application 662. As discussed above, 3D models 621 may virtual representations of three dimensional objects. Each model may include vertex and edge data which represent the geometry of modeled object. Further, the 3D model 621 may be created in any feasible manner, such as by manually specifying vertex and edge data or automatically based on a scan of a real-life object. In one embodiment, storage 620 may further store BSP trees indicating cuts and components of partitioned 3D models, as discussed in greater detail above with respect to FIG. 2.

Advantageously, embodiments disclosed herein provide a partition application that performs recursive partitioning of a 3D model until each component of the partitioned model fits within a given printing volume. Such an approach guarantees that each component produced by the partitioning can be printed by a 3D printer having the given printing volume. In various embodiments, recursive partitioning includes computing one or more objective functions such as total number of components and seam saliency. In such cases, cuts may be chosen based on a weighted sum of those objective functions, which tends to result in, for example, fewer total components and less salient seams. As a result of fewer total components and less salient seams, the printed components may be easier to assemble and may look more pleasing to observers, respectively.

In one embodiment, a binary space partition (BSP) tree is used to represent the partitioned model. Doing so ensures that components resulting from the partition can be assembled into a whole object because each side of a cut can always be individually assembled, and the individually assembled sides can then be combined. Embodiments disclosed herein further provide a connector placement application that determines locations for connectors used to link the components together. A lack of connectors or interfering connectors can affect whether the resulting components can be assembled, while having too many connectors can waste printing resources and make the components difficult to clean. To solve these problems, techniques disclosed herein determine locations for connectors such that each interface of adjacent components has at least one connector, no two connectors interfere with each other, and unnecessary connectors are avoided.

While the foregoing is directed to embodiments of the present invention, other and further embodiments of the invention may be devised without departing from the basic scope thereof, and the scope thereof is determined by the claims that follow.

What is claimed is:

1. A computer-implemented method for recursively partitioning a three-dimensional (3D) model of an object into two or more components for printing such that each of the components fits within a predefined printing volume associated with a 3D printer, comprising:
    sampling, via one or more processors, a plurality of planar cuts, wherein each of the sampled planar cuts partitions the 3D model into at least two components;
    evaluating one or more objective functions for each of the sampled planar cuts;
    selecting a cut from the sampled planar cuts based on the evaluation of the one or more objective functions;
    in response to determining that one or more components resulting from the selected cut do not fit within the predefined printing volume, further partitioning the one or more components that do not fit within the predefined printing volume until all partitioned components fit within the predefined printing volume; and
    printing, using the 3D printer and at least one printing material, physical components corresponding to the partitioned components that fit within the predefined printing volume.

2. The computer-implemented method of claim 1, wherein the one or more objective functions include one or more binary objective functions, the method further comprising:
    prior to selecting the cut, determining whether to reject the cut based on evaluation of at least one of the one or more binary objective functions.

3. The computer-implemented method of claim 2, wherein the one or more binary objective functions include a first binary objective function which determines structural soundness of each component resulting from a cut being evaluated and of the components resulting from the cut being evaluated after assembly.

4. The computer-implemented method of claim 2, wherein the one or more binary objective functions include a first binary objective function which determines a measure of feasibility for placing connectors on each of a plurality of components resulting from a cut being evaluated.

5. The computer-implemented method of claim 4, wherein the first binary objective function estimates a size of a set of feasible connectors for the components resulting from the cut being evaluated.

6. The computer-implemented method of claim 1, wherein one of the one or more objective functions estimates an upper bound on a number of total components resulting from a cut being evaluated.

7. The computer-implemented method of claim 1, further comprising:
    determining placement locations for a plurality of connectors on the partitioned components that fit within the predefined printing volume by approximately solving an optimization problem.

8. The computer-implemented method of claim 1, wherein the selected cut is stored as a node of a binary space partition (BSP) tree, and wherein each component resulting from the selected cut is stored in a respective leaf node of the BSP tree.

9. A computer-implemented method for recursively partitioning a three-dimensional (3D) model of an object into two or more components for printing such that each of the components fits within a predefined printing volume associated with a 3D printer, comprising:
    sampling, via one or more processors, a plurality of planar cuts, wherein each of the sampled planar cuts partitions the 3D model into at least two components;
    evaluating one or more objective functions for each of the sampled planar cuts, wherein one of the one or more objective functions determines an integral of penalties across a boundary of a cut being evaluated, the penalties being assessed for each point on the boundary based on one or more of ambient occlusion at the point, whether the point is at a texture edge, and user input corresponding to the point;
    selecting a cut from the sampled planar cuts based on the evaluation of the one or more objective functions; and
    in response to determining that one or more components resulting from the selected cut do not fit within the predefined printing volume, further partitioning the one or more components that do not fit within the predefined printing volume until all partitioned components fit within the predefined printing volume; and
    printing, using the 3D printer and at least one printing material, physical components corresponding to the partitioned components that fit within the predefined printing volume.

10. A non-transitory computer-readable storage medium storing a program, which, when executed by a processor performs an operation for recursively partitioning a three-dimensional (3D) model of an object into two or more components for printing such that each of the components fits within a predefined printing volume associated with a 3D printer, the operation comprising:
    sampling a plurality of planar cuts, wherein each of the sampled planar cuts partitions the 3D model into at least two components;
    evaluating one or more objective functions for each of the sampled planar cuts;
    selecting a cut from the sampled planar cuts based on the evaluation of the one or more objective functions;
    in response to determining that one or more components resulting from the selected cut do not fit within the predefined printing volume, further partitioning the one or more components that do not fit within the predefined printing volume until all partitioned components fit within the predefined printing volume; and
    causing, via one or more transmitted signals, the 3D printer to print, from at least one printing material, physical components corresponding to the partitioned components that fit within the predefined printing volume.

11. The computer-readable storage medium of claim 10, wherein the one or more objective functions include one or more binary objective functions, the operation further comprising:
    prior to selecting the cut, determining whether to reject the cut based on evaluation of at least one of the one or more binary objective function.

12. The computer-readable storage medium of claim 10, wherein the one or more binary objective functions include a first binary objective function which determines structural soundness of each component resulting from a cut being evaluated and of the components resulting from the cut being evaluated after assembly.

13. The computer-readable storage medium of claim 10, wherein the one or more binary objective functions include a first binary objective function which determines a measure of feasibility for placing connectors on each of a plurality of components resulting from a cut being evaluated.

14. The computer-readable storage medium of claim 13, wherein the first binary objective function estimates a size of a set of feasible connectors for the components resulting from the cut being evaluated.

15. The computer-readable storage medium of claim 10, the operation further comprising:
  determining placement locations for a plurality of connectors on the partitioned components that fit within the predefined printing volume by approximately solving an optimization problem.

16. The computer-readable storage medium of claim 10, wherein the selected cut is stored as a node of a binary space partition (BSP) tree, and wherein each component resulting from the selected cut is stored in a respective leaf node of the BSP tree.

17. A non-transitory computer-readable storage medium storing a program, which, when executed by a processor performs an operation for recursively partitioning a three-dimensional (3D) model of an object into two or more components such that each of the components fits within a predefined printing volume associated with a 3D printer, the operation comprising:
  sampling a plurality of planar cuts, wherein each of the sampled planar cuts partitions the 3D model into at least two components;
  evaluating one or more objective functions for each of the sampled planar cuts, wherein one of the one or more objective functions determines an integral of penalties across a boundary of a cut being evaluated, the penalties being assessed for each point on the boundary based on one or more of ambient occlusion at the point, whether the point is at a texture edge, and user input corresponding to the point;
  selecting a cut from the sampled planar cuts based on the evaluation of the one or more objective functions; and
  in response to determining that one or more components resulting from the selected cut do not fit within the predefined printing volume, further partitioning the one or more components that do not fit within the predefined printing volume until all partitioned components fit within the predefined printing volume; and
  causing, via one or more transmitted signals, the 3D printer to print, from at least one printing material, physical components corresponding to the partitioned components that fit within the predefined printing volume.

18. A system, comprising:
  a processor; and
  a memory, wherein the memory includes an application program executable in the processor to perform an operation for recursively partitioning a three-dimensional (3D) model of an object into two or more components such that each of the components fits within a predefined printing volume associated with a 3D printer, the operation comprising:
    sampling a plurality of planar cuts, wherein each of the sampled planar cuts partitions the 3D model into at least two components,
    evaluating one or more objective functions for each of the sampled planar cuts;
    selecting a cut from the sampled planar cuts based on the evaluation of the objective functions,
    in response to determining that one or more components resulting from the selected cut do not fit within the predefined printing volume, further partitioning the one or more components that do not fit within the predefined printing volume until all partitioned components fit within the predefined printing volume, and
    causing, via one or more transmitted signals, the 3D printer to print, from at least one printing material, physical components corresponding to the partitioned components that fit within the predefined printing volume.

19. The system of claim 18, wherein the selected cut is stored as a node of a binary space partition (BSP) tree, and wherein each component resulting from the selected cut is stored in a respective leaf node of the BSP tree.

* * * * *

UNITED STATES PATENT AND TRADEMARK OFFICE
CERTIFICATE OF CORRECTION

PATENT NO. : 10,025,882 B2
APPLICATION NO. : 13/585383
DATED : July 17, 2018
INVENTOR(S) : Ilya Baran et al.

Page 1 of 1

It is certified that error appears in the above-identified patent and that said Letters Patent is hereby corrected as shown below:

On the page 2, in Column 1, under "Other Publications", Line 5, delete "Gometry" and insert -- Geometry --, therefor.

In Column 6, Line 16, after "possible." delete "presence of an invalid connector.".

In Column 8, Line 43, delete "☐ p" and insert -- ☐p --, therefor.

In Column 10, Line 55, delete "$\omega_I \sum_{i,j}$" and insert -- $\omega_I \Sigma_{i,j}$ --, therefor.

In Column 14, Line 58, in Claim 11, delete "function." and insert -- functions. --, therefor.

Signed and Sealed this
Twentieth Day of November, 2018

Andrei Iancu
*Director of the United States Patent and Trademark Office*